(12) United States Patent
Sivakumar et al.

(10) Patent No.: US 11,536,749 B2
(45) Date of Patent: Dec. 27, 2022

(54) VOLTAGE-TO-CURRENT ARCHITECTURE AND ERROR CORRECTION SCHEMES

(71) Applicant: QUALCOMM Incorporated, San Diego, CA (US)

(72) Inventors: Ramkumar Sivakumar, San Diego, CA (US); Jingxue Lu, San Diego, CA (US); Sherif Galal, Irvine, CA (US); Xinwang Zhang, San Diego, CA (US); Kshitij Yadav, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/154,758

(22) Filed: Jan. 21, 2021

(65) Prior Publication Data

US 2021/0231710 A1    Jul. 29, 2021

Related U.S. Application Data

(60) Provisional application No. 62/965,542, filed on Jan. 24, 2020.

(51) Int. Cl.
*H03F 3/20* (2006.01)
*H03F 1/00* (2006.01)
(Continued)

(52) U.S. Cl.
CPC ....... *G01R 19/0023* (2013.01); *H03F 1/0227* (2013.01); *H03F 3/2173* (2013.01);
(Continued)

(58) Field of Classification Search
CPC ..... H03F 3/20; H03F 3/24; H03F 3/45; H03F 3/189; H03F 3/211; H03F 3/217; H03F 3/2173; H03F 3/2175; H03F 3/2178; H03F 1/0205; H03F 1/0211; H03F 1/0227; H03F 2200/03; H03F 2200/462; H03F 2200/481; H04R 3/00; H04R 3/007; H04R 3/12; G01R 19/0023
See application file for complete search history.

(56) References Cited

U.S. PATENT DOCUMENTS 4,201,943 A * 5/1980 Klank ................... H03J 5/0254
                                              455/185.1
4,384,261 A * 5/1983 Yokoyama ............ H03F 1/3217
                                              330/265
(Continued)

*Primary Examiner* — Thang V Tran
(74) *Attorney, Agent, or Firm* — Patterson+ Sheridan, L.L.P.

(57) ABSTRACT

Certain aspects of the present disclosure are generally directed to circuitry and techniques for voltage-to-current conversion. For example, certain aspects provide a circuit for signal amplification including a first amplifier; a first transistor, a gate of the first transistor being coupled to an output of the first amplifier and a drain of the first transistor being coupled to an output node of circuit; a first resistive element coupled between a first input node of the circuit and an input of the first amplifier; a second amplifier; a second transistor, a gate of the second transistor being coupled to an output of the second amplifier and a drain of the second transistor being coupled to the output node of circuit; and a second resistive element coupled between a second input node of the circuit and an input of the second amplifier.

23 Claims, 4 Drawing Sheets

(51) Int. Cl.
*H04R 3/00* (2006.01)
*G01R 19/00* (2006.01)
*H03F 3/217* (2006.01)
*H03F 1/02* (2006.01)

(52) U.S. Cl.
CPC ........... *H04R 3/00* (2013.01); *H03F 2200/03* (2013.01); *H03F 2200/462* (2013.01); *H03F 2200/481* (2013.01)

(56) References Cited

U.S. PATENT DOCUMENTS

| | | | |
|---|---|---|---|
| 2012/0044020 A1* | 2/2012 | Siniscalchi | H03F 3/2173 330/251 |
| 2014/0145789 A1* | 5/2014 | Sugimoto | H03F 3/087 330/252 |
| 2016/0065134 A1* | 3/2016 | Lu | H03F 1/0205 330/251 |
| 2018/0014119 A1* | 1/2018 | Chawla | H04R 3/007 |

* cited by examiner

VOLTAGE-TO-CURRENT ARCHITECTURE AND ERROR CORRECTION SCHEMES

CROSS-REFERENCE TO RELATED APPLICATION(S)

This application claims benefit of and priority to U.S. Provisional Application No. 62/965,542, filed Jan. 24, 2020, which is hereby expressly incorporated by reference herein in its entirety as if fully set forth below and for all applicable purposes.

FIELD

The present disclosure relates to audio signal processing, and more specifically, to circuitry for voltage-to-current conversion.

BACKGROUND

A speaker is a transducer that produces a pressure wave in response to an input electrical signal, and thus, sound is generated. The speaker input signal may be produced by an audio amplifier that receives a relatively lower voltage analog audio signal and generates an amplified signal (with a relatively higher voltage) to drive the speaker. A dynamic loudspeaker is typically composed of a lightweight diaphragm (a cone) connected to a rigid basket (a frame) via a flexible suspension (often referred to as a spider) that constrains a voice coil to move axially through a cylindrical magnetic gap. When the input electrical signal is applied to the voice coil, a magnetic field is created by the electric current in the coil, thereby forming a linear electric motor. By varying the electrical signal from the audio amplifier, the mechanical force generated by the interaction between the magnet and the voice coil is modulated and causes the cone to move back and forth, thereby creating the pressure waves interpreted as sound.

SUMMARY

Certain aspects of the present disclosure are generally directed to circuitry and techniques for current sensing, such as sensing current to a speaker in an audio application.

Certain aspects of the present disclosure are directed to a circuit for signal processing. The circuit generally includes a first amplifier; a first transistor, a gate of the first transistor being coupled to an output of the first amplifier and a drain of the first transistor being coupled to an output node of circuit; a first resistive element coupled between a first input node of the circuit and an input of the first amplifier, the first resistive being further coupled between the input node and a source of the first transistor; a second amplifier; a second transistor, a gate of the second transistor being coupled to an output of the second amplifier and a drain of the second transistor being coupled to the output node of circuit; and a second resistive element coupled between a second input node of the circuit and an input of the second amplifier, the second resistive element being further coupled between the other input node and a source of the second transistor.

Certain aspects of the present disclosure are directed to a method for signal processing. The method generally includes generating a first current through a first resistive element by driving, via a first amplifier, a gate of a first transistor based on a first voltage at a first input node, wherein the first resistive element is coupled between the first input node and an input of the first amplifier; providing the first current to an output node, a drain of the first transistor being coupled to the output node; generating a second current through a second resistive element by driving, via a second amplifier, a gate of a second transistor based on a second voltage at a second input node, wherein the second resistive element is coupled between the second input node and an input of the second amplifier; and providing the second current to the output node, a drain of the second transistor being coupled to the output node.

Certain aspects of the present disclosure are directed to an apparatus for signal processing. The apparatus generally includes means for generating a first current through a first resistive element by driving a gate of a first transistor based on a first voltage at a first input node; means for providing the first current to an output node; means for generating a second current through a second resistive element by driving a gate of a second transistor based on a second voltage at a second input node; and means for providing the second current to the output node.

In some aspects, the apparatus may also include: means for generating a third current through a third resistive element by driving a gate of a third transistor based on a third voltage at a third input node; means for providing the third current to another output node; means for generating a fourth current through a fourth resistive element by driving a gate of a fourth transistor based on a fourth voltage at a fourth input node; and means for providing the fourth current to the other output node. In some aspects, a voltage difference between the first input node and the third input node represents a first current flow, and a voltage difference between the second input node and the fourth input node represents a second current flow. In some aspects, the first current flow comprises a current through a first signal path of an H-bridge amplifier, and the second current flow comprises a current through a second signal path of the H-bridge amplifier.

In some aspects, the apparatus may also include: means for sensing an average between the first and third voltages at the first input node and the third input node; and means for setting a common-mode voltage associated with the means for generating the first current based on the average between the first and third voltages. In certain aspects, the apparatus may also include: means for sensing an average between the first and third voltages at the first input node and the third input node; and means for setting a voltage at a body terminal of a transistor used to implemented the first resistive element based on the average between the first and third voltages.

In certain aspects, the apparatus may also include means for calibrating for a mismatch between the first resistive element and the second resistive element by adjusting a resistance between the second input node and an input of the means for generating the first current. In some aspects, the apparatus may also include means for compensating for an error current flow to the output node by selectively coupling one or more capacitive elements between the output node and one of a voltage rail node and an electric ground node. The voltage rail node may have a voltage that is a fraction of a supply voltage for the means for generating the first current.

Certain aspects of the present disclosure are directed to an amplifier circuit. The amplifier circuit generally includes: an amplifier comprising a first switch, a second switch, a first resistor coupled to the first switch, and a second resistor coupled to the second switch; a first sensing path configured to convert a first voltage across the first resistor to a first sensed current; a second sensing path configured to convert a second voltage across the second resistor to a second sensed current; and a summing amplifier configured to sum the first and second sensed currents.

DETAILED DESCRIPTION

Certain aspects of the present disclosure are generally directed to circuitry and techniques for current sensing. For example, drive current for a speaker may be sensed for temperature control. Certain aspects provide voltage-to-current circuitry and error correction circuitry for the current sensing, as described in more detail herein.

Figure 1:
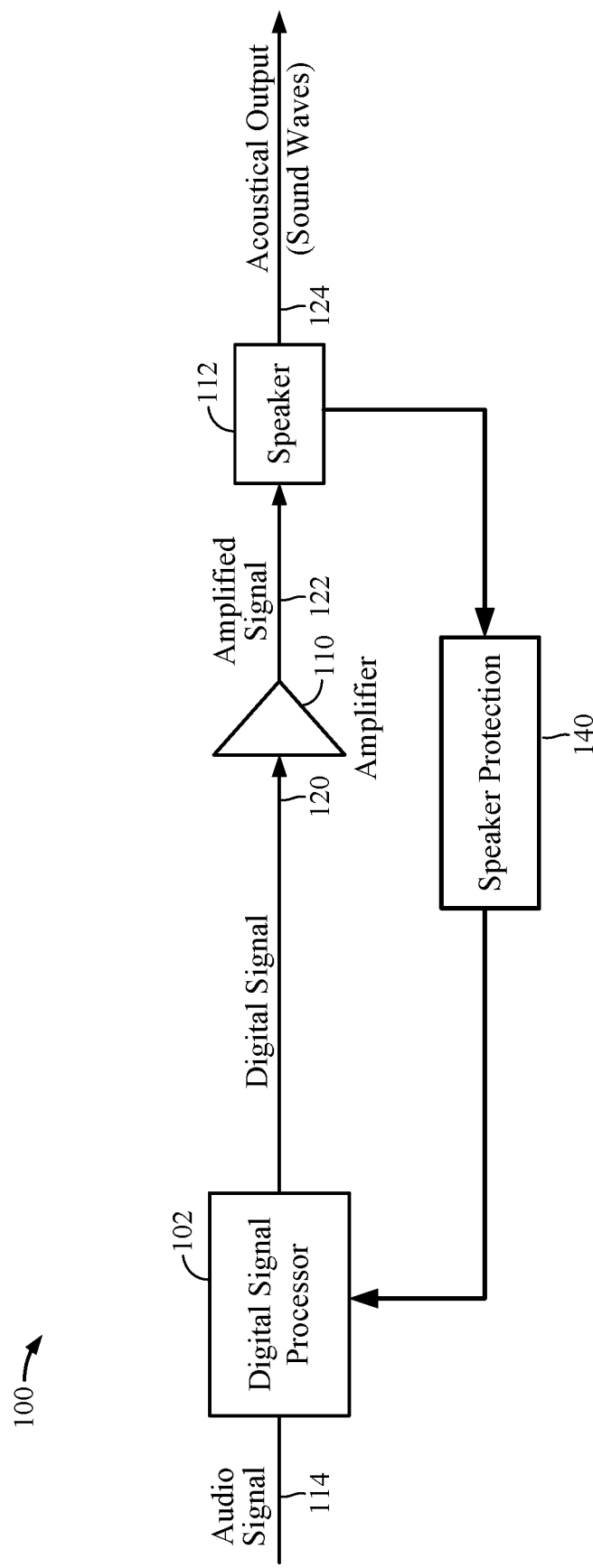
FIG. 1 illustrates an example audio amplifier system, in accordance with certain aspects of the present disclosure.

FIG. 1 illustrates an example audio amplifier system 100 (also referred to as an "audio system"), in accordance with certain aspects of the present disclosure. As illustrated, a digital signal processor (DSP) 102 may receive and process audio signals 114 (e.g., a digital audio signal) by applying a digital filter aimed at increasing audio quality. The filtered digital signal 120 produced by the DSP (or a further processed version thereof) may be used to control an amplifier 110 to generate an amplified signal 122. The amplified signal 122 may drive a speaker 112 to produce an acoustic output (e.g., sound waves) 124.

High output volume in mobile devices is becoming more and more important in next-generation mobile devices. Higher volume directly translates to higher output power. The higher volumes may be difficult to achieve with the relatively low voltages provided by lithium-ion batteries. Therefore, on-chip boost switchers may be used to boost the battery voltage to a higher level that supplies the speaker power amplifier (e.g., amplifier 110). The amplifier 110 may be implemented as a class-D amplifier due to the relatively high power efficiency associated with class-D amplifiers compared to other amplifier classes. The efficiency of the class-D amplifier may be further improved by implementing the class-D amplifier in an H-bridge configuration, as described below with respect to FIG. 2.

In certain aspects, a speaker protection module 140 may be used to sense a drive current for the speaker 112, and provide a digital representation of the current to the DSP 102 for speaker protection. Speaker protection modules (e.g., module 140) may have multiple functions. For example, speaker protection modules may sense the speaker coil temperature and, in combination with the DSP 102, control the gain of an amplifier (e.g., amplifier 110) to avoid coil burnout. The temperature of the speaker coil may be proportional to direct-current (DC) resistance of the coil, and thus the sensed drive current for the speaker 112 may be used as a temperature sense mechanism in order to control the gain of the amplifier. Additionally or alternatively, speaker protection modules may provide impedance measurement to sense the resonant frequency of the speaker coil and provide excursion control to avoid damage to the speaker membrane. Accurate voltage/current (V/I) sensing in the presence of strong class-H modulation (e.g., used to achieve high efficiency in speaker drivers) can be difficult to achieve.

Certain aspects of the present disclosure provide a voltage-to-current (V2I) architecture for current sensing, as described in more detail herein. The V2I architecture described herein may provide improved distortion performance in the presence of strong class-H modulation, as compared to conventional implementations.

Figure 2:
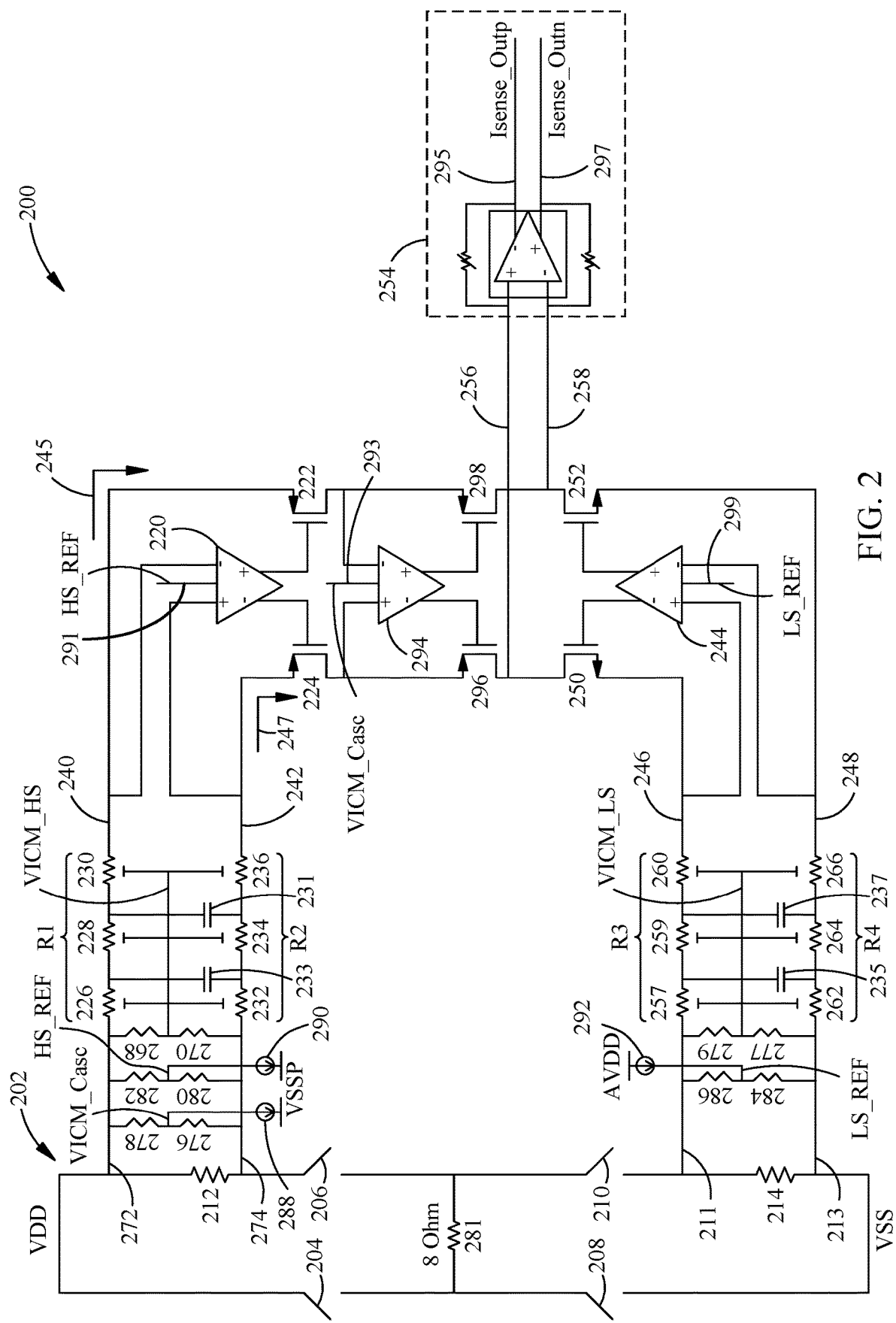
FIG. 2 illustrates a circuit for voltage-to-current conversion, in accordance with certain aspects of the present disclosure.

FIG. 2 illustrates an example V2I circuit 200, in accordance with certain aspects of the present disclosure. As illustrated, an H-bridge amplifier 202 (e.g., corresponding to the amplifier 110) may be used to drive a speaker (e.g., speaker 112), represented by the resistive element 281 (e.g., an 8Ω speaker). As illustrated, the amplifier 202 includes switches 204, 206, 208, 210 and current-sensing resistive elements 212, 214 (also referred as "current sense resistive elements") coupled in series with respective switches 206, 210. The switches 204, 206, 208, 210 may be controlled based on the digital signal 120 (or a further processed version thereof). In some aspects, the switches 204, 206 may be implemented using p-type metal-oxide-semiconductor (PMOS) transistors and the switches 208, 210 may be implemented using n-type metal-oxide-semiconductor (NMOS) transistors. The current-sensing resistive element 212 may be coupled between V2I circuit input nodes 272, 274, and the current-sensing resistive element 214 may be coupled between V2I circuit input nodes 211, 213. The V2I circuit input node 272 may be coupled to the voltage rail VDD and the V2I circuit input node 213 may be coupled to a reference potential node VSS. The voltage across the current-sensing resistive elements 212, 214 may be sensed and converted to a current by the V2I circuit 200, the sensed voltages representing the drive current of the speaker.

The V2I circuit 200 may include an amplifier 220 having a positive output driving a gate of a transistor 222 and a negative output driving a gate of a transistor 224. Moreover, a sense path of the V2I circuit 200 may include resistive elements 226, 228, 230 (collectively referred to as "R1"), and another sense path of the V2I circuit 200 may include resistive elements 232, 234, 236 (collectively referred to as "R2"). While R1 and R2 are each illustrated in FIGS. 2 (and 3) as being implemented using three restive elements, any number of resistive elements may be used. The sense paths having the resistive elements R1 and R2 may be referred to as the positive sense path of the V2I circuit 200. The amplifier 220 may be coupled to a voltage rail VDD (e.g., a positive supply voltage) and a voltage rail VDDL (e.g., a negative supply voltage), wherein VDDL is less than VDD, for example by 1.8V. In other words, although not shown in FIG. 2, the positive supply voltage of amplifier 220 may be VDD and the negative supply voltage of the amplifier 220 may be VDDL.

The amplifier 220 senses the voltage at nodes 240, 242, and drives the gates of transistors 222, 224 to sink a current 245 across R1, and a current 247 across R2, in effect converting the voltage across the resistive element 212 to currents 245, 247.

Currents 245, 247 are provided to respective output nodes 256, 258 of the V2I circuit 200. For example, drains of transistors 222, 224, 250, 252 may be electrically coupled to corresponding output nodes 256, 258. The transistors 250, 252 may be implemented as n-type metal-oxide-semiconductor (NMOS) transistors. Moreover, each of transistors 222, 224 may be implemented as a p-type metal-oxidesemiconductor (PMOS) transistor. The output nodes 256, 258 are coupled to respective input nodes of a summing amplifier 254 to generate positive and negative current sense outputs (Isense_Outp, Isense_Outn) at output nodes 295, 297. Similarly, the amplifier 244 senses the voltage at nodes 246, 248 and drives transistors 250, 252 to convert the voltage across the resistive element 214 to a current flowing across the resistive elements 257, 259, 260 (collectively referred to as "R3") and a current across resistive elements 262, 264, 266 (collectively referred to as "R4"). The sense paths having the resistive elements R3 and R4 may be referred to as the negative sense path of the V2I circuit 200. The currents associated with the positive and negative sense paths are effectively summed at output nodes 256, 258 and provided to the amplifier 254 for generating Isense_Outp and Isense_Outn. The output of the summing amplifier 254 may be used to drive an analog-to-digital converter (ADC) for providing a digital signal to a DSP (e.g., DSP 102) to be used for speaker protection.

As used herein, an input common-mode voltage (VICM) (e.g., at an input common-mode node) of an amplifier generally refers to an average of voltages applied to inputs of the amplifier. In certain aspects, resistive elements 268, 270 may be coupled between input nodes 272, 274, a high-side (HS) VICM node (labeled "VICM_HS") between the resistive elements 268, 270 being coupled to a body terminal (e.g., bulk terminal) of transistors used to implement R1 and R2, for example to reduce non-linearity associated with R1 and R2. In other words, the bulk of the transistors used to implement R1 and R2 may be driven based on the average of the voltages at input nodes 272, 274 to reduce the non-linearity associated with R1 and R2 due to conductivity modulation. Similarly, a node (labeled "VICM_LS") between resistive elements 277, 279 (which may be coupled between input nodes 211, 213) may be used to drive the body of transistors used to implement R3 and R4. The voltage at VICM_HS corresponds to the VICM of amplifier 220 (or amplifier 294), and the voltage at VICM_LS corresponds to the VICM of amplifier 244.

In certain aspects, a high-voltage (HV) cascode device may be used for voltage protection for transistors 224, 222. For example, the HV cascode device may include an amplifier 294 that may be used to drive gates of transistors 296, 298 coupled between respective transistors 224, 222 and respective output nodes 256, 258. Each of transistors 296, 298 may be implemented as a PMOS transistor. The transistors 296, 298 are coupled in cascode with transistors 224, 222, respectively. The amplifier 294 may be implemented for voltage isolation. For example, the transistors 222, 224 may be implemented as low-voltage devices that provide better low-noise performance (e.g., as compared to high-voltage devices) allowing for a more accurate voltage-to-current conversion. The transistors 296, 298 may be implemented as high-voltage devices and coupled between respective output nodes 256, 258 and respective transistors 224, 222, reducing the voltage applied across the low-voltage transistors 224, 222.

In certain aspects, input common-mode tracking may be implemented to mitigate common-mode-to-differential-mode (CM2DM) conversion due to resistance mismatch (e.g., resistance mismatch between R1 and R2). For example, resistive elements 276, 278 and resistive elements 280, 282 may be coupled between input nodes 272, 274, as illustrated. A current source 288 may be used to sink a current from a VICM cascode node (labeled "VICM_Casc") between resistive elements 276, 278 to a reference potential node VSSP, and a current source 290 may be used to sink a current from a high-side (HS) reference voltage node (labeled "HS_REF") between resistive elements 280, 282, in effect setting an input common-mode voltage (e.g., at an input common-mode node) of the amplifiers 220, 294. In other words, the voltage at the VICM_Casc node between resistive elements 276, 278 may be provided to input 293 of the amplifier 294 to be used as a reference voltage for the amplifier 294, and the voltage at the HS_REF node between the resistive elements 280, 282 may be provided to input 291 of the amplifier 220 to be used as a reference voltage for the amplifier 220. Similarly, a current source 292 may be used to source a current from an analog voltage rail (AVDD) to a low-side (LS) reference voltage node (labeled "LS_REF") between resistive elements 284, 286 to set an input common-mode voltage of the amplifier 244. In other words, the voltage at the LS_REF node between resistive elements 284, 286 may be provided to input 299 of amplifier 244 to be used as a reference voltage for the amplifier 244. In certain aspects, one or more capacitive elements 231, 233, 235, 237 may be implemented for filtering. In some aspects, AVDD may be a different voltage rail than VDD. In some aspects, VSSP may be a different reference potential node than VSS. In some aspects, the voltage provided at VDD may be the same as the voltage provided at VDD and/or the voltage provided at VSS may be the same as the voltage provided at VSSP even if these voltages are supplied at different voltage rails and/or nodes.

Figure 3:
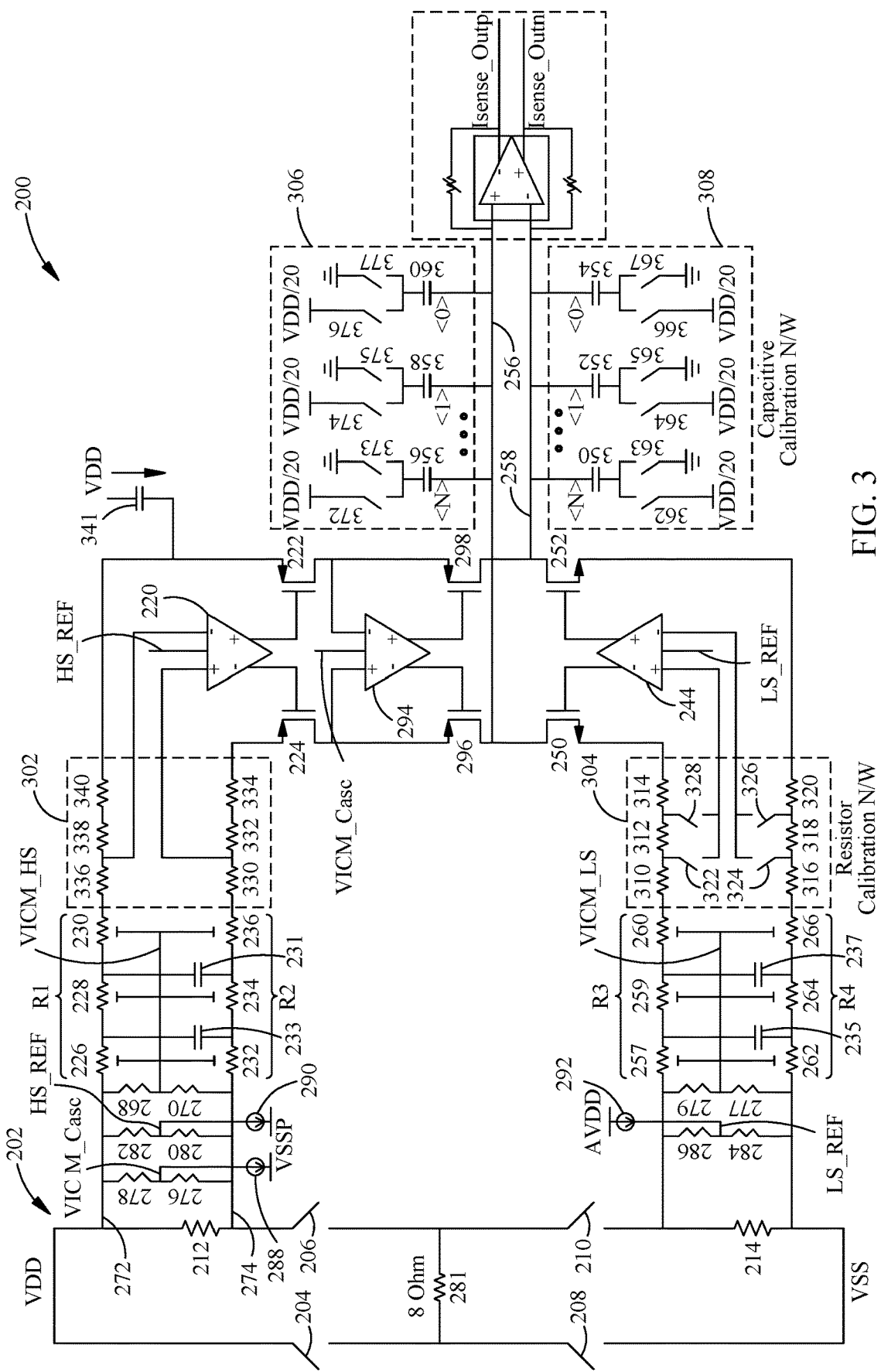
FIG. 3 illustrates a circuit for voltage-to-current conversion implemented with resistor calibration networks and capacitive calibration networks, in accordance with certain aspects of the present disclosure.

FIG. 3 illustrates the V2I circuit 200 implemented with resistor calibration networks 302, 304 and capacitive calibration networks 306, 308, in accordance with certain aspects of the present disclosure. While the V2I circuit 200 is implemented with both a resistor calibration network and a capacitive calibration network to facilitate understanding, the aspects of the present disclosure may be implemented with only a resistor calibration network, only a capacitive calibration network, or both. The resistor calibration networks 302, 304 may be configured to compensate, or at least adjust, for resistance mismatch between the positive and negative sense paths. For example, a gain mismatch may be present between the positive and negative sense paths if the series resistance associated with R2 is not matched with the series resistance associated with R3, and/or if the series resistance associated with R1 is not matched with the series resistance associated with R4. The gain error may manifest as second harmonic distortion at the output of the V2I circuit 200.

The resistor calibration network 302 includes resistive elements 336, 338, 340 coupled in series between the resistive element 230 and the transistor 222, and resistive elements 330, 332, 334 coupled in series between the resistive element 236 and the transistor 224. While the resistor calibration network 302 is implemented using three resistive elements on each sense path (e.g., resistive elements 336, 338, 340), any number of resistive elements may be used. Similarly, while the resistor calibration network 304 is implemented using three resistive elements on each sense path (e.g., resistive elements 310, 312, 314), any number of resistive elements may be used. As illustrated, the negative and positive inputs of the amplifier 220 may be coupled to a node between the resistive elements 336, 338 and a node between the resistive elements 330, 332, respectively.

The resistor calibration network 304 includes resistive elements 310, 312, 314 coupled in series between the resistive element 260 and the transistor 250, and resistive elements 316, 318, 320 coupled in series between the resistive element 266 and the transistor 252. The resistor calibration network 304 may also include switches 322, 328, 324, 326. The positive input of the amplifier 244 may be selectively coupled to a node between resistive elements 310, 312 or a node between resistive elements 312, 314 by closing one of switches 322, 328, and the negative input of the amplifier 244 may be selectively coupled to a node between resistive elements 316, 318 or a node between resistive elements 318, 320 by closing one of switches 324, 326. Thus, during calibration, one of switches 322, 328, and one of switches 324, 326 may be closed to compensate for (or at least reduce) the gain error that would otherwise be caused by the resistance mismatch in the positive and negative sense paths. The series resistive elements of the resistor calibration networks allow for the option to calibrate the gain error between the positive and negative paths to achieve reduced distortion (e.g., less than −95 dB distortion), in some cases. Moreover, the switches 322, 324, 326, 328 carry little to no current, and thus, may be implemented using simple switch design.

In certain aspects, capacitive elements may be coupled to a high impedance node (e.g., nodes 256, 258) of the V2I circuit 200 for capacitive calibration. There may be strong second harmonics on high impedance nodes (e.g., nodes 256, 258) of the amplifier structure (e.g., H-bridge amplifier 202) due to the class-H tracking scheme. In other words, a second harmonic signal may be present at the supply voltage VDD of the H-bridge amplifier 202. Capacitive mismatch (an example of which is described below) may cause error current to flow to the output of the amplifier structure (e.g., at nodes 256, 258) and result in second harmonics at the output of the V2I circuit 200. In certain aspects of the present disclosure, current may be injected with polarity opposite to the error current (e.g., to nodes 256, 258 via capacitive calibration networks 306, 308) to cancel out (or at least reduce) the error current introduced due to systematic layout mismatch.

For example, capacitive calibration networks 306, 308 may include capacitive elements 350, 352, 354, 356, 358, 360, each of which may be selectively coupled to a voltage rail (labeled "VDD/20," although other voltages may be used; in some aspects, two or more capacitors in the network 306 and/or 308 are coupled to different voltages or voltage rails) or a ground node (e.g., a reference potential node). There may be parasitic capacitance, which is represented by capacitor 341 in FIG. 3, between the voltage rail VDD and the source of the transistor 222, causing an error current having a strong second harmonic to flow to the node 258. The capacitive calibration network 308 may be configured to compensate, or at least adjust, for impact of the current flow due to the parasitic capacitance 341. For example, one or more of the capacitive elements 350, 352, 354 may be coupled between node 258 and the voltage rail (or plurality of voltage rails) by closing one or more of switches 362, 364, 366, and opening one or more corresponding switches 363, 365, 367. Similarly in the capacitive calibration network 306, one or more of switches 372, 374, 376 may be closed, and a corresponding one or more of switches 373, 375, 377 may be opened, to compensate, or at least adjust, for parasitic capacitance impacting the current flow to node 256. The switches described and shown in FIG. 3 may be controlled by a controller, such as the digital signal processor 102 described with respect to FIG. 1.

In certain aspects, capacitor values of the capacitive calibration networks 306, 308 may be scaled up, and the calibration voltage rail value (e.g., VDD/20) for the capacitive calibration networks may be scaled down, allowing for good matching of the capacitive elements with the parasitic capacitance (e.g., parasitic capacitance 341) of the V2I circuit and de-sensitizing the effect of having a class-H voltage applied to the high impedance node of the V2I circuit. For example, the voltage rail VDD/20 may be a fraction (e.g., ½₀, or any other fraction such as ⅒) of the voltage rail VDD of the V2I circuit 200, allowing the capacitive elements 350, 352, 354, 356, 358, 360 to be implemented with a higher capacitance as compared to the parasitic capacitance 341. In other words, it may be difficult to implement each of the capacitive elements 350, 352, 354, 356, 358, 360 to have a capacitance that is as small as the parasitic capacitance 341. Therefore, the voltage rail node VDD/20 to which the capacitive elements are selectively coupled may be set as a fraction of the voltage rail VDD, allowing each of the capacitive elements 350, 352, 354, 356, 358, 360 to be implemented with a higher capacitance as compared to the parasitic capacitance 341. The capacitive calibration networks 306, 308 may be controlled to track the error current for different operating frequencies (in some cases, for all operating frequencies) of the V2I circuit 200.

While each of the example capacitive calibration networks 306, 308 are illustrated as being implemented with three capacitive elements to facilitate understanding, any number of capacitive elements may be used. For example, the example capacitive calibration networks 306, 308 may be implemented using less than or greater than three capacitive elements. Further, any other means of selectively coupling a capacitive element to a high impedance node of the circuit 200 and/or of varying a capacitance coupled to a high impedance node may be implemented. For example, a variable capacitive element may be coupled between a voltage rail (e.g., VDD or a fraction thereof) and the node 256 or 258.

The V2I circuit described herein may provide less than −80 dB distortion performance within an audio band with class-H modulation. Moreover, since the summing associated with the V2I circuit happens in the current domain, fewer passive components may be used, resulting in less error and distortion sources as compared to conventional implementations. The V2I circuit may also provide a low cost trimming mechanism (e.g., calibration) to further improve performance. While some examples provided herein have been described with respect to an audio amplifier to facilitate understanding, the aspects described herein may be implemented for any suitable application where a V2I circuit may be used.

Figure 4:
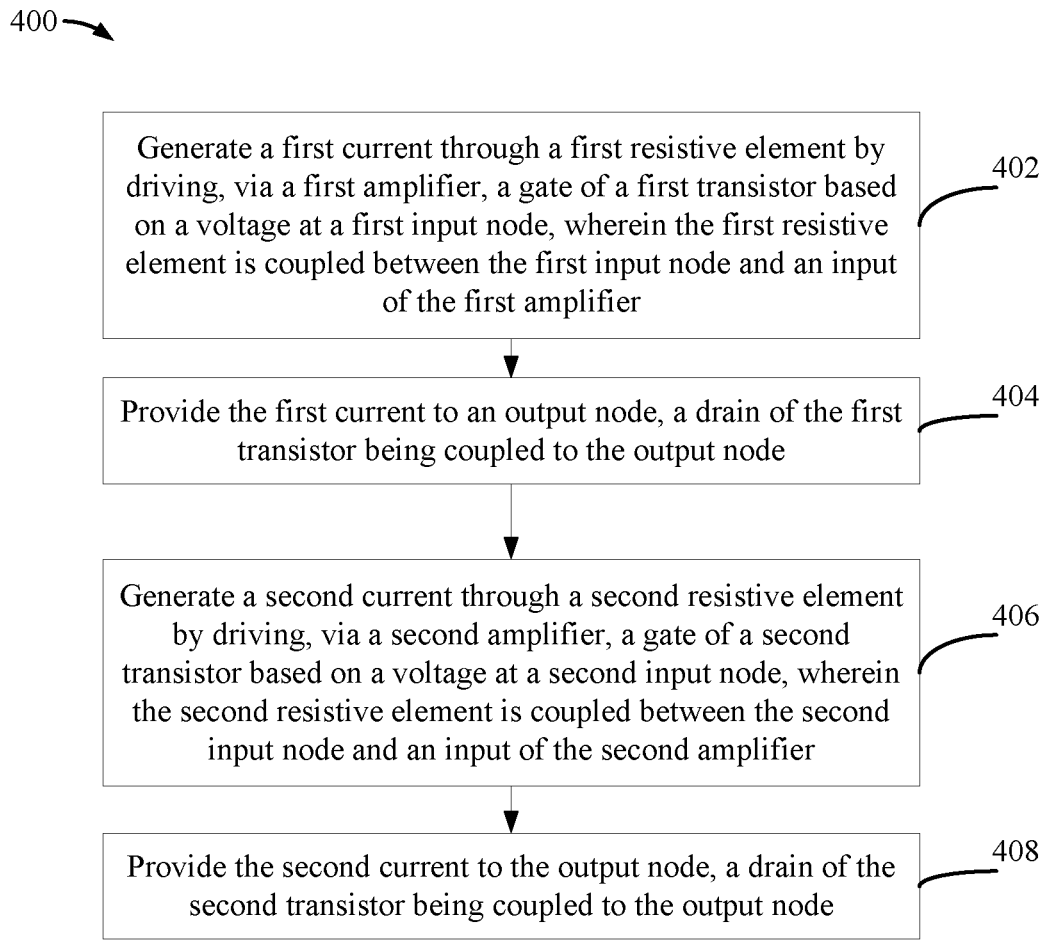
FIG. 4 is a flow diagram illustrating example operations for signal processing, in accordance with certain aspects of the present disclosure.

FIG. 4 is a flow diagram illustrating example operations 400 for signal processing, in accordance with certain aspects of the present disclosure. The operations 400 may be performed by a signal processing system, such as the V2I circuit 200 and/or H-bridge amplifier 202.

The operations 400 begin, at block 402, with the signaling processing system generating a first current (e.g., current 245) through a first resistive element (e.g., R1) by driving, via a first amplifier (e.g., amplifier 220), a gate of a first transistor (e.g., transistor 222) based on a voltage at a first input node (e.g., input node 272). In some aspects, the first resistive element may be coupled between the first input node and an input of the first amplifier. At block 404, the signaling processing system provides the first current to an output node (e.g., output node 258), a drain of the first transistor being coupled to the output node. At block 406, the signal processing system generates a second current through a second resistive element (e.g., R4) by driving, via a second amplifier (e.g., amplifier 244), a gate of a second transistor (e.g., transistor 252) based on a voltage at a second input node (e.g., input node 213), and at block 408, provides the second current to the output node, a drain of the second transistor being coupled to the output node. In some aspects, the second resistive element may be coupled between the second input node and an input of the second amplifier.

In some aspects, the signal processing system may also generate a third current (e.g., current 247) through a third resistive element (e.g., R2) by driving, via the first amplifier, a gate of a third transistor (e.g., transistor 224) based on a voltage at a third input node (e.g., input node 274), and provide the third current to another output node (e.g., output node 256). The signal processing system may also generate a fourth current through a fourth resistive element (e.g., R3) by driving, via the second amplifier, a gate of a fourth transistor (e.g., transistor 250) based on a voltage at a fourth input node (e.g., input node 211), and provide the fourth current to the other output node. A fifth resistive element may be coupled between the first and third input nodes, and a sixth resistive element may be coupled between the second and fourth input nodes.

In some aspects, a first voltage difference between the first input node and the third input node represents a first current flow, and a second voltage difference between the second input node and the fourth input node represents a second current flow. For example, the first current flow may be a current through a first signal path (e.g., a path through switch 206) of an H-bridge amplifier (e.g., H-bridge amplifier 202), and the second current flow may be a current through a second signal path (e.g., a path through switch 210) of the H-bridge amplifier.

In certain aspects, the signal processing system may sense an average between voltages at the first input node and the third input node, and set a common-mode voltage associated with the first amplifier based on the average between the voltages. In some aspects, the signal processing system may sense an average between voltages at the first input node and the third input node, and set a voltage at a body terminal of a transistor used to implement the first resistive element based on the average between the voltages.

In certain aspects, the signal processing system may calibrate for a mismatch between the first resistive element and the second resistive element by adjusting a resistance between the second input node and an input (e.g., negative input) of the first amplifier. In some aspects, the signal processing system may compensate for an error current flow (e.g., error current due to parasitic capacitance 341) to the output node by selectively coupling one or more capacitive elements (e.g., capacitive elements 350, 352, and/or 354) between the output node and one of a voltage rail node (e.g., voltage rail VDD/20) and a ground node of the circuit. In some aspects, the voltage rail node has a voltage that is a fraction of a supply voltage for the first amplifier.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein. The algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

In certain aspects, means for generating and means for providing may include an amplifier, such as the amplifier 220, amplifier 294, or amplifier 244. In certain aspects, means for sensing and means for setting may include resistive elements, such as resistive elements 276, 278 and/or a current source, such as the current source 288. In certain aspects, means for calibrating may include a resistor calibration network, such as the resistor calibration network 302 or 304. Means for compensating may include a capacitive calibration network, such as the capacitive calibration network 306 or 308.

What is claimed is:

1. A circuit for signal processing, comprising:
   a first amplifier;
   a first transistor, a gate of the first transistor being coupled to an output of the first amplifier and a drain of the first transistor being coupled to an output node of the circuit;
   a first resistive element coupled between a first input node of the circuit and an input of the first amplifier, the first resistive element being further coupled between the first input node and a source of the first transistor;
   a second amplifier;
   a second transistor, a gate of the second transistor being coupled to an output of the second amplifier and a drain of the second transistor being coupled to the output node of the circuit; and
   a second resistive element coupled between a second input node of the circuit and an input of the second amplifier, the second resistive element being further coupled between the second input node and a source of the second transistor.

2. The circuit of claim 1, further comprising:
   a third transistor, a gate of the third transistor being coupled to another output of the first amplifier and a drain of the third transistor being coupled to another output node of the circuit;
   a third resistive element coupled between a third input node of the circuit and another input of the first amplifier, the third resistive element being further coupled between the third input node and a source of the third transistor;
   a fourth transistor, a gate of the fourth transistor being coupled to another output of the second amplifier and a drain of the fourth transistor being coupled to the other output node of the circuit; and
   a fourth resistive element coupled between a fourth input node of the circuit and another input of the second amplifier, the fourth resistive element being further coupled between the fourth input node and a source of the fourth transistor.

3. The circuit of claim 2, further comprising:
   a first current sense resistive element coupled between the first input node and the third input node; and
   a second current sense resistive element coupled between the second input node and the fourth input node.

4. An audio system comprising the circuit of claim 3, the audio system further comprising an H-bridge amplifier having:
   a first switch in a first path between a voltage rail and a speaker, the first path having the first current sense resistive element; and
   a second switch in a second path between the speaker and a reference potential node, the second path having the second current sense resistive element.

5. The circuit of claim 3, further comprising:
   a fifth resistive element coupled to the first input node;
   a sixth resistive element coupled to the third input node; and
   a current source coupled to a node between the fifth resistive element and the sixth resistive element, the node being further coupled to an input common-mode node of the first amplifier.

6. The circuit of claim 3, further comprising:
   a fifth resistive element coupled to the first input node; and
   a sixth resistive element coupled to the third input node, wherein a node between the fifth resistive element and the sixth resistive element is coupled to a body terminal of a transistor used to implement the first resistive element.

7. The circuit of claim 1, further comprising:
   a third amplifier having an input coupled to the drain of the first transistor; and
   a third transistor having a gate coupled to an output of the third amplifier, a source coupled to the input of the third amplifier, and a drain coupled to the output node of the circuit.

8. The circuit of claim 1, further comprising:
   a first plurality of resistive elements coupled in series between the first resistive element and the source of the first transistor;
   a second plurality of resistive elements coupled in series between the second resistive element and the source of the second transistor; and
   one or more switches, each coupled between the input of the second amplifier and a respective node between two respective resistive elements of the second plurality of resistive elements.

9. The circuit of claim 1, further comprising:
   a plurality of switches; and
   one or more capacitive elements coupled to the output node, wherein the plurality of switches are configured to selectively couple each of the one or more capacitive elements to one of a voltage rail node and a ground node of the circuit.

10. The circuit of claim 9, wherein the voltage rail node is configured to receive a voltage that is a fraction of a supply voltage for the first amplifier.

11. The circuit of claim 1, further comprising a summing amplifier having an input coupled to the drains of the first transistor and the second transistor.

12. The circuit of claim 1, wherein the first transistor comprises a p-type metal-oxide-semiconductor (PMOS) transistor, and wherein the second transistor comprises an n-type metal-oxide-semiconductor (NMOS) transistor.

13. A method for signal processing, comprising:
   generating a first current through a first resistive element by driving, via a first amplifier, a gate of a first transistor based on a first voltage at a first input node, wherein the first resistive element is coupled between the first input node and an input of the first amplifier;
   providing the first current to an output node, a drain of the first transistor being coupled to the output node;
   generating a second current through a second resistive element by driving, via a second amplifier, a gate of a second transistor based on a second voltage at a second input node, wherein the second resistive element is coupled between the second input node and an input of the second amplifier; and
   providing the second current to the output node, a drain of the second transistor being coupled to the output node.

14. The method of claim 13, further comprising:
   generating a third current through a third resistive element by driving, via the first amplifier, a gate of a third transistor based on a third voltage at a third input node;
   providing the third current to another output node;

generating a fourth current through a fourth resistive element by driving, via the second amplifier, a gate of a fourth transistor based on a fourth voltage at a fourth input node; and providing the fourth current to the other output node.

15. The method of claim 14, further comprising:

sensing an average between the first and third voltages at the first input node and the third input node; and setting a common-mode voltage associated with the first amplifier based on the average between the first and third voltages.

16. The method of claim 13, further comprising calibrating for a mismatch between the first resistive element and the second resistive element by adjusting a resistance between the second input node and the input of the first amplifier.

17. The method of claim 13, further comprising compensating for an error current flow to the output node by selectively coupling one or more capacitive elements between the output node and one of a voltage rail node and an electric ground node.

18. An amplifier circuit, comprising:

an amplifier comprising a first switch, a second switch, a first resistor coupled to the first switch, and a second resistor coupled to the second switch;

a first sensing path configured to convert a first voltage across the first resistor to a first sensed current by driving at least one first transistor in the first sensing path;

a second sensing path configured to convert a second voltage across the second resistor to a second sensed current; and a summing amplifier configured to sum the first and second sensed currents.

19. The amplifier circuit of claim 18, further comprising a processor configured to adjust a gain of the amplifier based on the summed currents.

20. The amplifier circuit of claim 18, wherein the first and second switches are coupled to an output of the amplifier, and wherein the output is further coupled to a speaker.

21. The amplifier circuit of claim 18, wherein the second sensing path is configured to convert the second voltage across the second resistor to the second sensed current by driving at least one second transistor in the second sensing path.

22. The method of claim 13, wherein the first resistive element is further coupled between the first input node and a source of the first transistor.

23. The method of claim 22, wherein the second resistive element is further coupled between the second input node and a source of the second transistor.

* * * * *